United States Patent
Ichitsubo et al.

(10) Patent No.: US 7,202,735 B2
(45) Date of Patent: Apr. 10, 2007

(54) MULTI-BAND POWER AMPLIFIER MODULE FOR WIRELESS COMMUNICATION DEVICES

(75) Inventors: Ikuroh Ichitsubo, Kanagawa Prefecture (JP); Kanya Kubota, Shiga-ken (JP)

(73) Assignee: Micro-Mobio, Palo Alto ( * ) Notice: Subject to any disclaimer, the term of this patent is extended or adjusted under 35 U.S.C. 154(b) by 0 days.

(21) Appl. No.: 11/323,788

(22) Filed: Dec. 30, 2005

(65) Prior Publication Data

US 2006/0158253 A1  Jul. 20, 2006

Related U.S. Application Data

(63) Continuation-in-part of application No. 11/039,687, filed on Jan. 19, 2005, now Pat. No. 7,084,702.

(51) Int. Cl.
*H03F 3/68* (2006.01)
(52) U.S. Cl. .................. 330/126; 330/124 R; 330/285; 330/296
(58) Field of Classification Search ............. 330/126, 330/124 R, 285, 296
See application file for complete search history.

(56) References Cited

U.S. PATENT DOCUMENTS

| | | | |
|---|---|---|---|
| 6,175,279 B1* | 1/2001 | Ciccarelli et al. | 330/296 |
| 6,463,267 B1* | 10/2002 | Akamine et al. | 455/253.2 |
| 6,731,167 B2* | 5/2004 | Suzuki et al. | 330/134 |
| 6,919,762 B2* | 7/2005 | Akamine et al. | 330/133 |
| 7,091,587 B2* | 8/2006 | Sato et al. | 257/685 |
| 2004/0203552 A1* | 10/2004 | Horiuchi et al. | 455/333 |

* cited by examiner

*Primary Examiner*—Patricia Nguyen
(74) *Attorney, Agent, or Firm*—Tran & Associates

(57) ABSTRACT

A multi-band power amplifier module includes a first power amplifier that amplifies a first input radio frequency signal in a first frequency band in response to a first bias control signal. A second power amplifier amplifies a second input radio frequency signal in a second frequency band in response to a second bias control signal. A first bias control circuit produces the first bias control signal and a second bias control circuit produces the second bias control signal in response to step gain signals received at a step gain terminal. The module has first and second rows of pins oppositely positioned on the module and coupled to the first and second power amplifiers and first and second bias circuits.

20 Claims, 7 Drawing Sheets

Top View

Bottom View

MULTI-BAND POWER AMPLIFIER MODULE FOR WIRELESS COMMUNICATION DEVICES

RELATED APPLICATION

The present invention is continuation-in-part of U.S. application Ser. No. 11/039,687 filed on Jan. 19, 2005, now U.S. Pat. No. 7,084,702 entitled "MULTI-BAND PA MODULE FOR WIRELESS COMMUNICATION DEVICES" and related to the commonly assigned U.S. patent application Ser. No. 10/041,863, titled "Multilayer RF Amplifier Module" by Wang, et al., filed on Oct. 22, 2001, U.S. patent application Ser. No. 10/385,058, titled "Power amplifier Module for wireless communication devices" by Ichitsubo et al, filed on Mar. 9, 2003, U.S. patent application Ser. No. 10/385,059, titled "Accurate Power Sensing Circuit for Power Amplifiers by Ichitsubo et al, filed on Mar. 9, 2003, U.S. patent application Ser. No. 10/804,737, titled "RF front-end module for wireless communication devices" by Ichitsubo et al., filed Mar. 18, 2004, U.S. patent application Ser. No. 10/972,858, titled "Frequency filtering circuit for wireless communication devices" by Kubota et al, filed Oct. 25, 2004, filed and U.S. patent application Ser. No. 10/972, 636, titled "Diplexer circuit for wireless communication devices" by Kubota et al, filed Oct. 25, 2004. The disclosures of these applications are hereby incorporated by reference.

BACKGROUND

The present invention relates to radio frequency (RF) power amplifiers (PA) module. Portable devices such as laptop personal computers (PC), Personal Digital Assistant (PDA) and cellular phones with wireless communication capability are being developed in ever decreasing size for convenience of use. Correspondingly, the electrical components thereof must also decrease in size while still providing effective radio transmission performance. However, the substantially high transmission power associated with RF communication increases the difficulty of miniaturization of the transmission components.

A major component of the wireless communication device is the radio frequency PA. The PA is conventionally in the form of a semiconductor integrated circuit (IC) chip or die in which signal amplification is effected with substantial power. The amplifier chip is interconnected in a circuit with certain off-chip components such as inductors, capacitors, resistors, and transmission lines used for controlling operation of the amplifier chip and providing impedance matching of the input and output RF signals. The amplifier chip and associated components are typically assembled by interconnected metal circuit and bond wires on a printed circuit board (PCB) having a dielectric substrate or a lead frame.

Among significant considerations in the miniaturization of RF amplifier circuits is the required impedance matching for the input and output RF signals of the amplifier. Input and output impedance matching circuits typically include capacitors, resistors, and inductors in associated transmission lines or micro strips for the RF signals into and out of the amplifier chip. However, these impedance matching circuits may require specifically tailored off-chip components located remotely from the amplifier IC chip. Accordingly, the application circuitry must include many electrical input and output terminals or bonding Pins to which the corresponding portions of the off-chip impedance matching circuits are separately joined. This increases the difficulty of assembly and required size of the associated components, and affects the overall manufacturability of the portable devices.

One important requirement for the state-of-the-art wireless devices is to provide power amplification in a plurality of frequency bands. The quality and power level of the amplified RF signals need to be properly controlled. The amplification of RF signals is required to be linear over a wide signal power range in each of the plurality of frequency bands. Preferably the amplification is reduced or increased according to input RF signal, transmittance range and data rate so that power consumption can be optimized.

SUMMARY

In one aspect, the present application relates to a multi-band power amplifier module includes a first power amplifier configured to amplify a first input radio frequency signal in a first frequency band in response to a first bias control signal to produced a first output radio frequency signal; a first bias circuit configured to output the first bias control signal in response to the first step gain signal at the step gain terminal; a second power amplifier configured to amplify a second input radio frequency signal in a second frequency band in response to a second bias control signal to produced a second output radio frequency signal; a second bias circuit configured to output the second bias control signal in response to the second step gain signal at the step gain terminal, and first and second rows of pins oppositely positioned on the module and coupled to the first and second power amplifiers and first and second bias circuits.

In another aspect, the present application relates to a multi-band power amplifier module, comprising: a power sensing terminal configured to receive a first power sensing signal and a second power sensing signal; a first power amplifier configured to amplify a first input radio frequency signal in a first frequency band in response to the first power sensing signal to produced a first output radio frequency signal; a first power sensing circuit configured to output the first power sensing signal at the power sensing terminal; a second power amplifier configured to amplify a second input radio frequency signal in a second frequency band in response to the second power sensing signal to produced a second output radio frequency signal; and a second power sensing circuit configured to output the second power sensing signal at the power sensing terminal. The module has first and second rows of pins oppositely positioned on the module and coupled to the first and second power amplifiers and first and second bias circuits.

An advantage of the present invention is that the power amplifier is capable of amplifying radio frequency signals in a plurality of frequency bands with efficient circuit. The power amplifiers module include power sensing circuits and bias control circuits that optimally control the bias current and operation characteristics of the power amplifiers. As a result, the quality, the linearity, and current consumption of the amplified signals are significantly improved across a plurality of frequency bands over a wide dynamic range. The frequency range can cover from several megahertz (MHZ) to tens of gigahertz (GHZ).

The power sensing bias control circuits for different power amplifiers operating at different frequency bands can be integrated within the RF amplifier module. In particular, the power sensing and the bias control terminals can be shared among different power amplifiers to reduce foot print of the power amplifier module. The integrated RF amplifier module is therefore compact and lower cost.

A plurality of power supply terminals can be provided to supply power to each power amplifier. The flexibility of providing power from one or more power supply terminals enables greater amount power being supplied to the power amplifiers, which is crucial for wireless applications requiring high power amplification for Wi-Fi and Wi-Max applications.

The power amplifier circuit can be fabricated on semiconductor materials such as Gallium Arsenide Heterojunction Bipolar Transistors (GaAs HBT). The RF power amplifier module can include a multi-layer three-dimensional substrate or a lead frame having a bottom metal layer adapted to bond with the printed circuit board (PCB) of a wireless communication device. The substrate can include one or more upper layers adapted to receive the amplifier chip and other off-chip components. The bottom layer includes grounding metal Pins that are located at the center and at each corner, which is registered and adapted to bond with the circuit pattern on PCB of the wireless communication device. The metal Pins are connected to the upper layers through the multilayer three-dimensional substrate by a plurality of metal via holes.

The RF amplifier module is suitable to applications in various wireless data and voice communications standards and protocols, including Global System for Mobile Communications (GSM), General Packet Radio Service (GPRS), Code Division Multiple Access (CDMA), Wideband CDMA, Universal Mobile Telecommunications System (UMTS), IEEE 802.11, IEEE 802.16 (Wi-Max), and others. The PA module in accordance to the present invention especially provides reliable amplification to the Wi-Fi and Wi-Max applications.

Additional features and advantages of the invention will be set forth in the description, which follows, and in part will be obvious from the description, or may be learned by the practice of the invention. The features and advantages of the invention may be realized and obtained by means of the instruments and combinations particularly pointed out in the appended claims. These and other features of the present invention will become apparent from the following description and appended claims, or may be learned by the practice of the invention as set forth hereinafter.

BRIEF DESCRIPTION OF THE DRAWINGS

The accompanying drawings, which are incorporated in and form a part of this specification, illustrate embodiments of the invention and, together with the description, serve to explain the principles of the invention.

DESCRIPTION OF INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Figure 1:
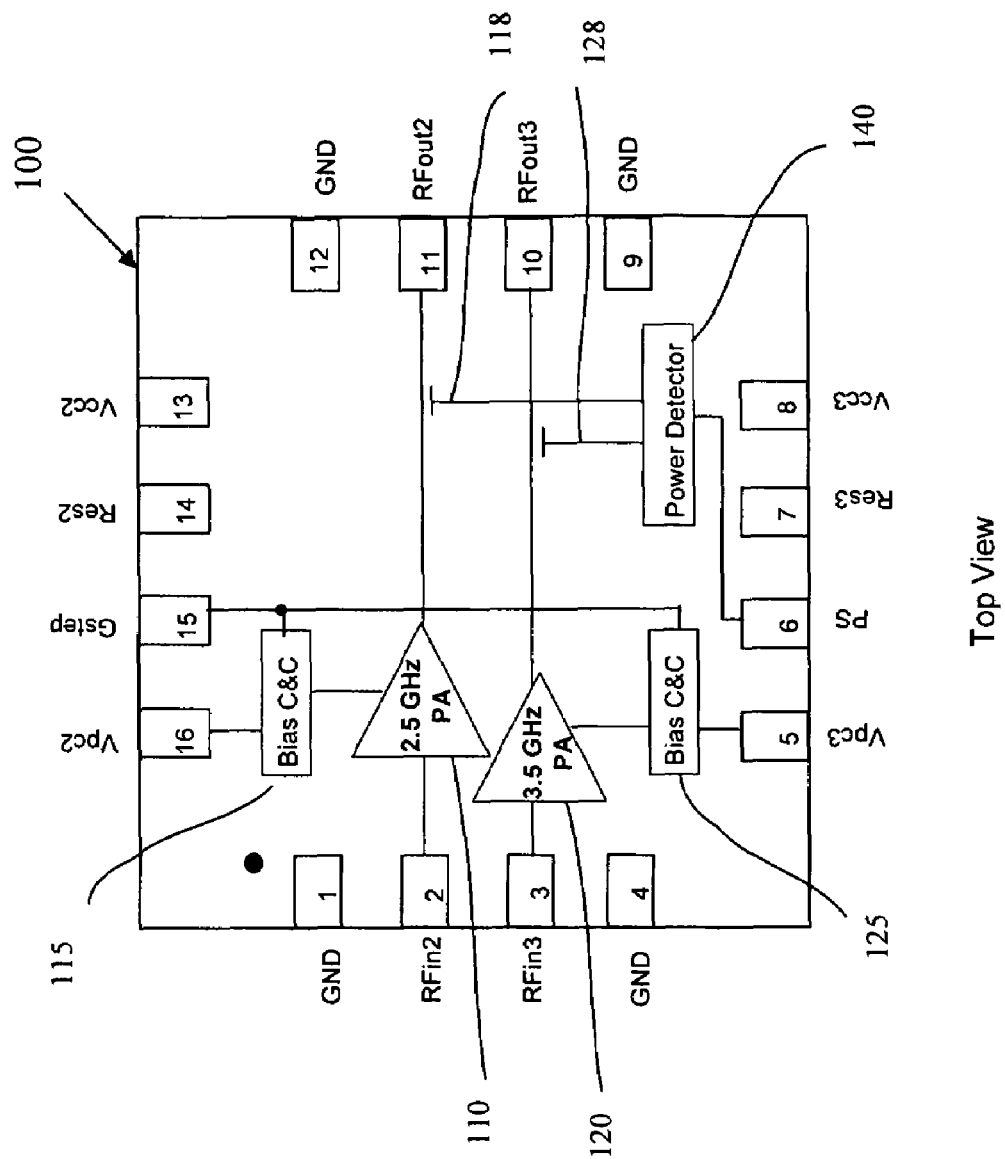
FIG. 1 illustrates a top view diagram of a power amplifier module capable of amplifying radio frequency signals at two radio frequency bands in accordance to an embodiment of the present invention.

As shown in FIG. 1, a power amplifier module 100 provides a unitary or common component that may be conveniently assembled in wireless devices such as cellular phone, mobile computers, handheld wireless digital devices, and for Wi-Fi and Wi-Max applications. In the present invention, the term "module" refers to such a unitary device for wireless communications, comprising integrated power amplifiers and other circuitry and auxiliary electronic components. The power amplifier module 100 is capable of amplifying radio frequency signals in a plurality of frequency bands. As shown in the top view diagram of FIG. 1, the power amplifier module 100 comprises a first power amplifier 110 and a second power amplifier 120. For example, the first power amplifier 110 can amplify radio frequency signals in a frequency band centered around 2.5 GHz. The second power amplifier 120 can amplify radio frequency signals in a frequency band centered around 3.5 GHz. The power amplifier module 100 is compatible with other radio frequencies such as 5 GHz, 700 MHz, etc.

The power amplifier module 100 includes four sides and a plurality of metal electrodes (often referred as pins or terminals) along each side. The pins or terminals can provide RF signal input and control signal input to the power amplifiers as well as output RF or power sensing signals. As shown in FIG. 1, the power amplifier module 100 includes an input side on the left having pins 1 and 4 as ground, and pin 2 (RFin2) and pin 3 (RFin3) respectively for receiving input RF signals for the first power amplifier 110 and the second power amplifier 120. The power amplifier module 100 also includes an output side on the right having pins 9 and 12 as ground, and pin 11 (RFout2) and pin 10 (RFout3) respectively for receiving output RF signals from the first power amplifier 110 and the second power amplifier 120. The upper side of the power amplifier module 100 includes pin 16 (Vpc2) for receiving input signals to bias control circuit 115 for the first power amplifier 110. The lower side of the power amplifier module 100 includes pin 5 (Vpc3) for receiving input signals to bias control circuit 125 for the second power amplifier 120.

In accordance with one embodiment of the present invention, pin 15 (Gstep or gain step) along the upper side of the power amplifier module 100 receives step gain signals for both the bias control circuit 115 and the bias control circuit 125. The amplified RF signals output from the first power amplifier 110 and the second power amplifier 120 can be detected respectively by capacitance coupling 118 and 128. In response, a power sensing circuit 140 produces power-sensing signals at pin 6 (PS). Since only one of the two power amplifiers 110 and 120 are in operation at each time, the power sensing signals from the two power amplifiers 110 and 120 can be output at a shared terminal at pin 6. The sharing of the power sensing terminal at pin 6 and the step gain control terminal at pin 15 reduces the number of pins, the footprint, and manufacturing cost of the power amplifier module 100.

In accordance with another embodiment of the present invention, the upper side of the amplifier module 100 includes two power supply pins 13 (Vcc2) and 14 (Res2). In low power amplifying applications, the power is supplied to the first power amplifier circuits by pin 13 whereas pin 14 is used as a reserved power supply pin. Both pins 13 and 14 an be used for supplying power for high power applications such as Wi-Fi and Wi-Max wireless applications. Similarly, the lower side of the amplifier module 100 also includes a power supply pin 8 (Vcc3) and a reserved power supply pin 7 (Res3).

Figure 2:
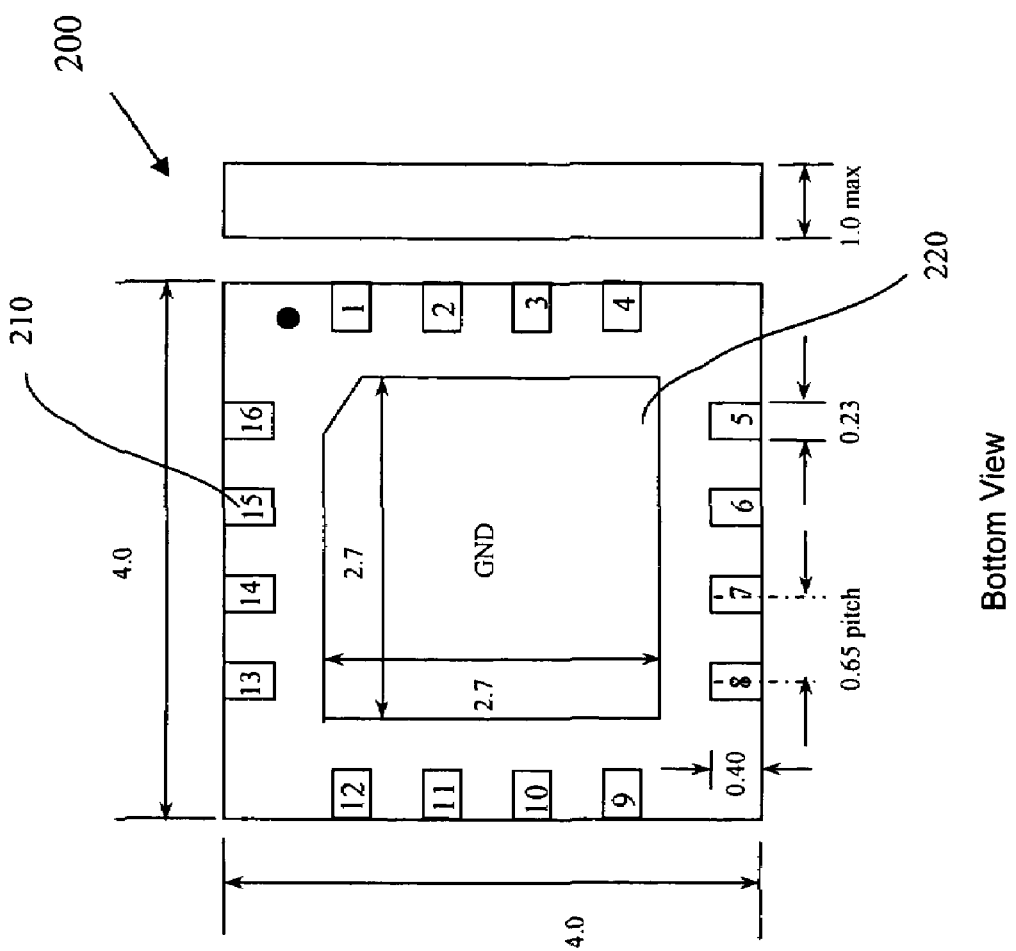
FIG. 2 is a bottom view of electrical layout of the power amplifier module of FIG. 1.

The bottom view of the power amplifier module 100 is shown in FIG. 2. The pin-out 200 of the power amplifier module 100 when viewed from the bottom is flip symmetry of the pin-out when viewed from the top. Exemplified dimensions are also labeled in FIG. 2 in millimeter) to show the small foot print of the power amplifier module 100 which are achieved by integrated circuit designs and shared electrodes between the power amplifiers for different frequency bands.

The power amplifier module 100 can further comprise frequency filter circuits and diplexers that can receive the input radio frequency signals and output a radio frequency signal at a selective frequency (e.g. one of 2.5 GHz and 3.5 GHz). Details of frequency circuit and diplexer are disclosed in the above referenced and commonly assigned U.S. patent application Ser. No. 10/972,858, titled "Frequency filtering circuit for wireless communication devices" by Kubota et al, filed Oct. 25, 2004, filed and U.S. patent application Ser. No. 10/972,636, titled "Diplexer circuit for wireless communication devices" by Kubota et al, filed Oct. 25, 2004, the disclosures of which are hereby incorporated by reference.

Figure 3:
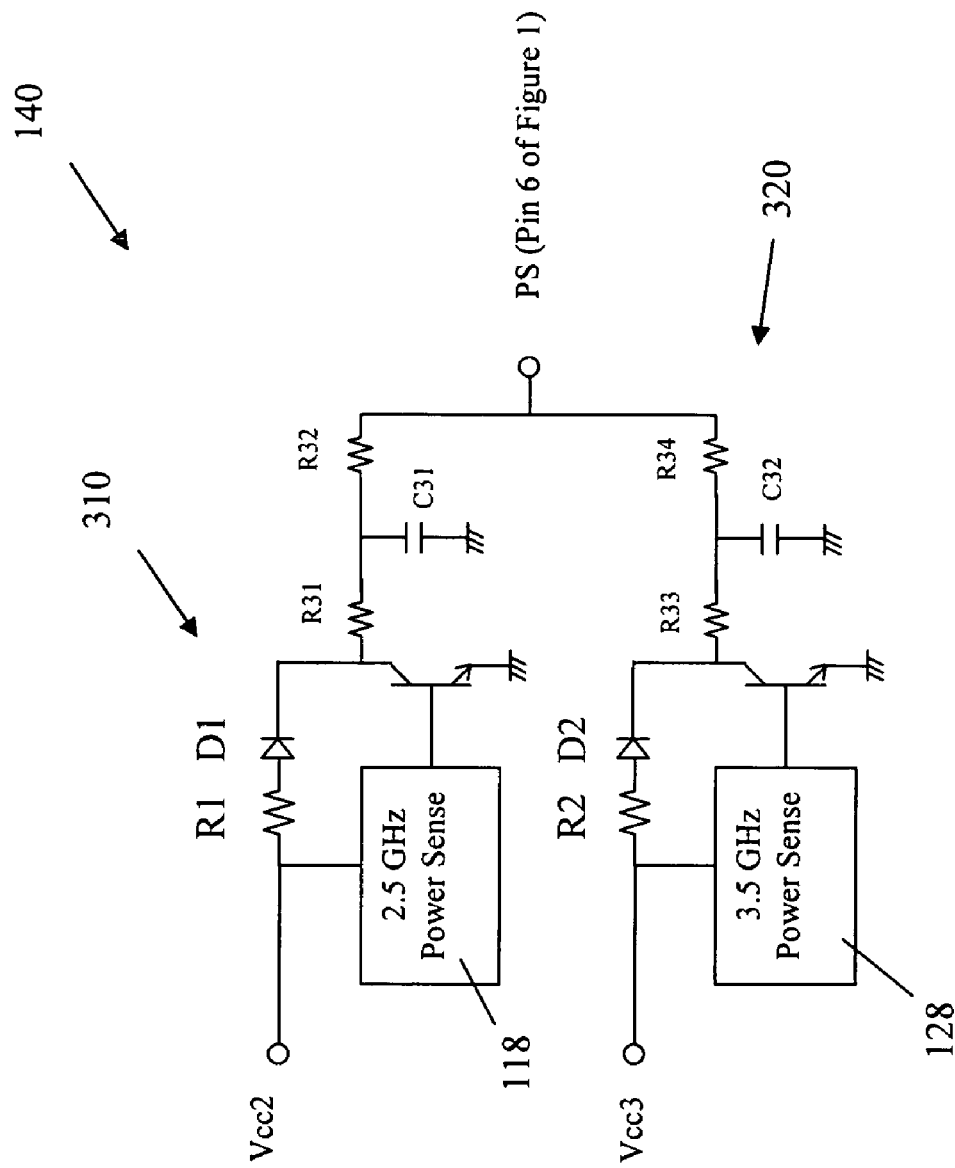
FIG. 3 illustrates power-sensing circuits for the two power amplifiers sharing the same terminal for power sensing output.

FIG. 3 illustrates power-sensing circuit 140 that is configured to detect amplified RF signals output from the first and the second power amplifiers 110 and 120. The power sensing circuit 140 includes a first power sensing circuit 310 and a second power sensing circuit 320. The first power sensing circuit 310 receives the amplified RF signals output from the first power amplifier 110 detected by capacitance coupling 118. The detected amplified RF signals are amplified by a transistor through the coupling of a resistor R1 and diode D1. The power sensing signals produced as a result are coupled by a RC circuit to pin 6 (PS) of the power amplifier module 100 (shown in FIG. 1). The amplified RF signals from the second power amplifier 120 are similarly detected by capacitance coupling 128, amplified and coupled by another RC circuit to the same electrode pin 6 (PS) of the power amplifier module 100 in FIG. 1.

Diodes D1 and D2 in the first power sensing circuit 310 and a second power sensing circuit 320 are critical in preventing undesirable reverse coupling of signals from the power sensing output pin 6 back to the amplifier output circuits. As a result, power-sensing circuits are integrated between different frequency bands to enable small device footprint without introducing cross-band interference.

Figure 4:
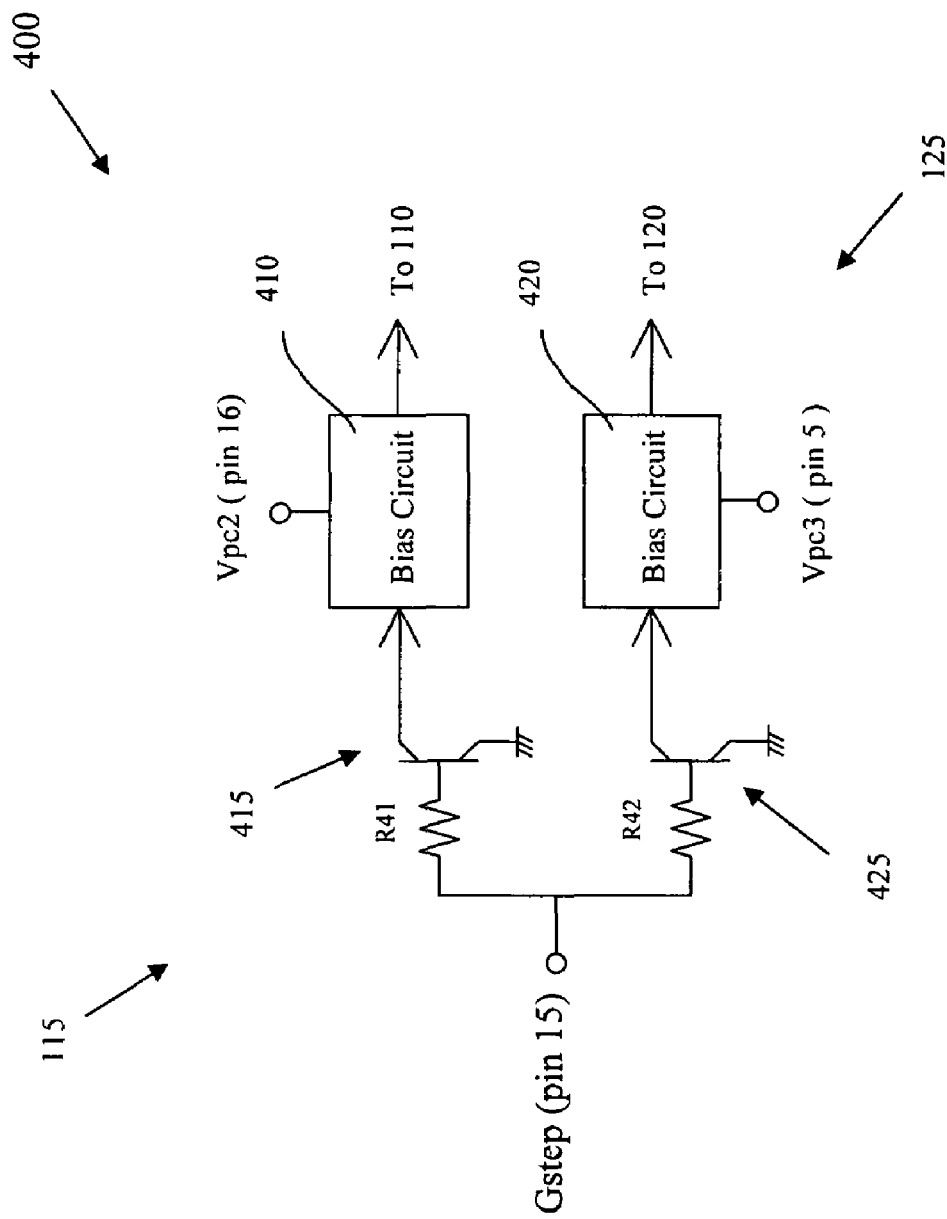
FIG. 4 illustrates bias control circuits for the two power amplifiers sharing the same step gain terminal.

FIG. 4 shows the bias control circuit 400 that includes the bias control circuit 115 and the bias control circuit 125 respectively controlling the bias voltages of the first power amplifier 110 and the second power amplifier 120 for amplifying RF signals in the two frequency bands (e.g. 2.5 GHz and 3.5 GHz). The first bias circuits 410 receive DC power at Vpc2 (pin 16 of FIG. 1). The second bias circuits 420 receive DC power at Vpc3 (pin 5). The bias circuit 400 receives a gain control signal at gain control (pin 15). The gain control signal is coupled with the first bias circuits 410 by a switch circuit that comprises a resistor R41 and a transistor 415. The gain control signal is coupled with the second bias circuits 420 by a switch circuit that comprises a resistor R42 and a transistor 425.

The first power amplifier 110 is controlled by a bias control circuit 115 and a power sensing circuit 140. The bias control circuit 115 is configured to output a first bias control signal and a second bias control signal depending on the voltage value of the gain control signal at step gain (pin 15). The first power amplifier 110 amplifies the input radio frequency signals by a first gain in response to the first bias control signal and by a second gain in response to the second bias control signal. The multiple bias control signals and multiple gains are designed to broaden the dynamic gain range for the power amplifier module 100. For example, the range of the gain for each of the first gain and the second gain can cover a range of 20 db. The first gain can be 20 db or higher than the second gain. The amplification at each of the first gain and the second gain can be referred to as an amplification mode. For example, the power amplifier 110 can perform at a low gain amplification mode and a high gain amplification mode. The bias control circuit 125 is similarly configured to output a first bias control mode and a second bias control mode to control the gains of the second power amplifier 120 for amplifying radio frequency signals at 3.5 GHz.

In another embodiment, the bias control circuit 115 or the bias control circuit 125 can output three bias control modes. The three additive amplification modes can be referred as step gains. Each of the bias control mode can control the first power amplifier 110 to amplify the input radio frequency signals by a different gain. The first gain can be 20 db or higher than the second gain. The second gain can be 20 db or higher than the third gain. The three amplification modes of amplification can realize an amplification range of 40 dB or more. Similarly, a bias circuit can output four or more bias control signals to enable the power amplifier to realize an amplification range of 60 db or more.

Other details of the operations of the bias control circuits 115 and 125 and power sensing circuit 140 as well as the design and benefits of the electric grounding in wireless power amplifier modules are disclosed in the commonly assigned and the above mentioned U.S. patent application Ser. No. 10/041,863, titled "Multilayer RF Amplifier Module" by Wang, et al., filed on Oct. 22, 2001, U.S. patent application Ser. No. 10/385,058, titled "Power amplifier Module for wireless communication devices" by Ichitsubo et al, filed on Mar. 9, 2003, U.S. patent application Ser. No. 10/385,059, titled "Accurate Power Sensing Circuit for Power Amplifiers by Ichitsubo et al, filed on Mar. 9, 2003, U.S. patent application Ser. No. 10/804,737, titled "RF front-end module for wireless communication devices" by Ichitsubo et al., filed Mar. 18, 2004. The disclosures of these applications are incorporated herein by reference.

Figure 5:
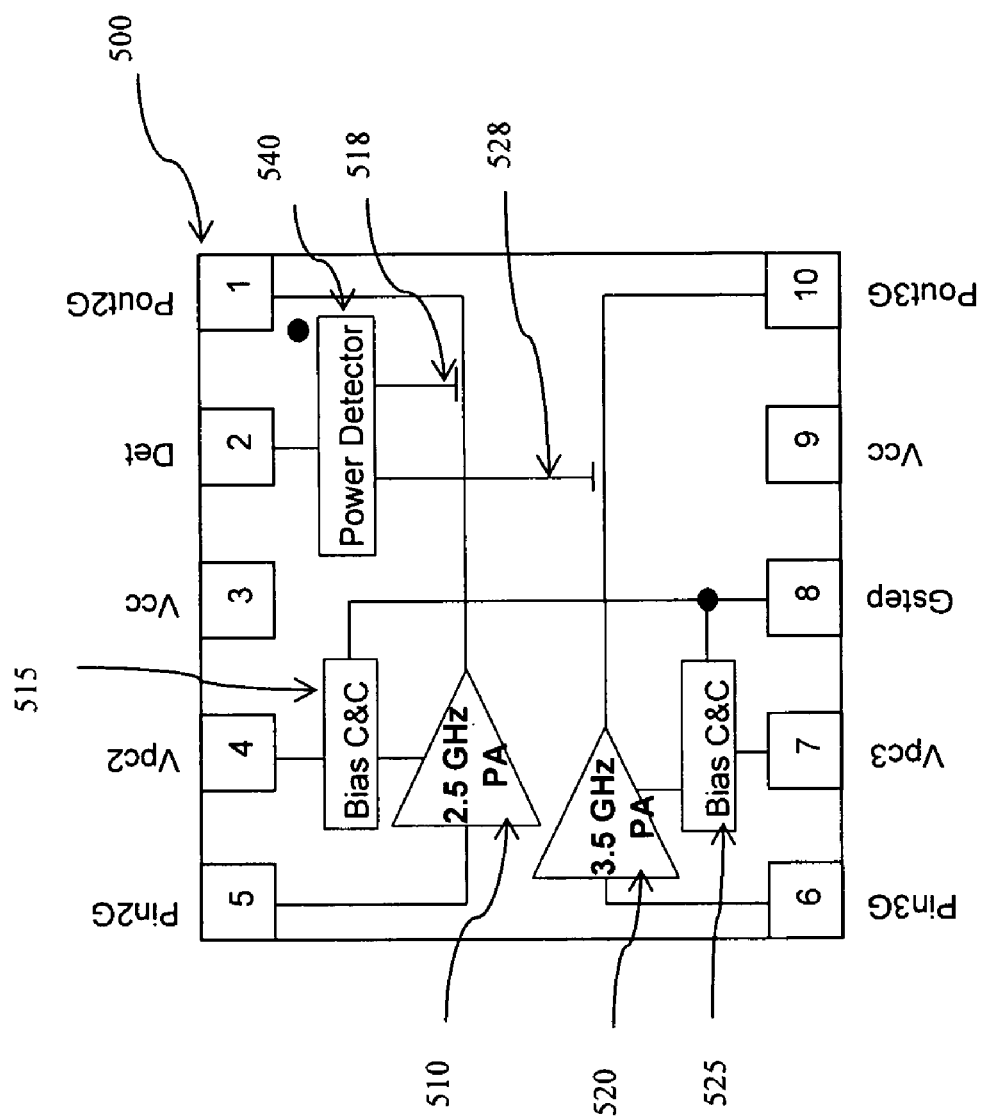
FIG. 5 shows a second embodiment of a dual power amplifier device.

FIG. 5 shows a second embodiment of a dual power amplifier module or device 500. As in FIG. 1, two power amplifiers 510 and 520 are provided. The input and output pins for the device 500 are arranged on parallel sides of the device 500. Thus, pin 5 receives an input for the PA 510. Pin 4 receives a bias control signal from a bias control circuit 515 for the PA 510. Pin 3 receives power, while pin 2 receives the output of a power detector 540. The output of PA 510 is presented at pin 1. Correspondingly, pin 6 is the input for PA 520 and pin 10 is the output of PA 520. Pin 7 is connected to a bias control circuit 525, which in turn controls the PA 520. Pin 8 receives a gain step control signal which is provided to both bias control circuits 515 and 525. Pin 9 is connected to the power supply.

Figure 6:
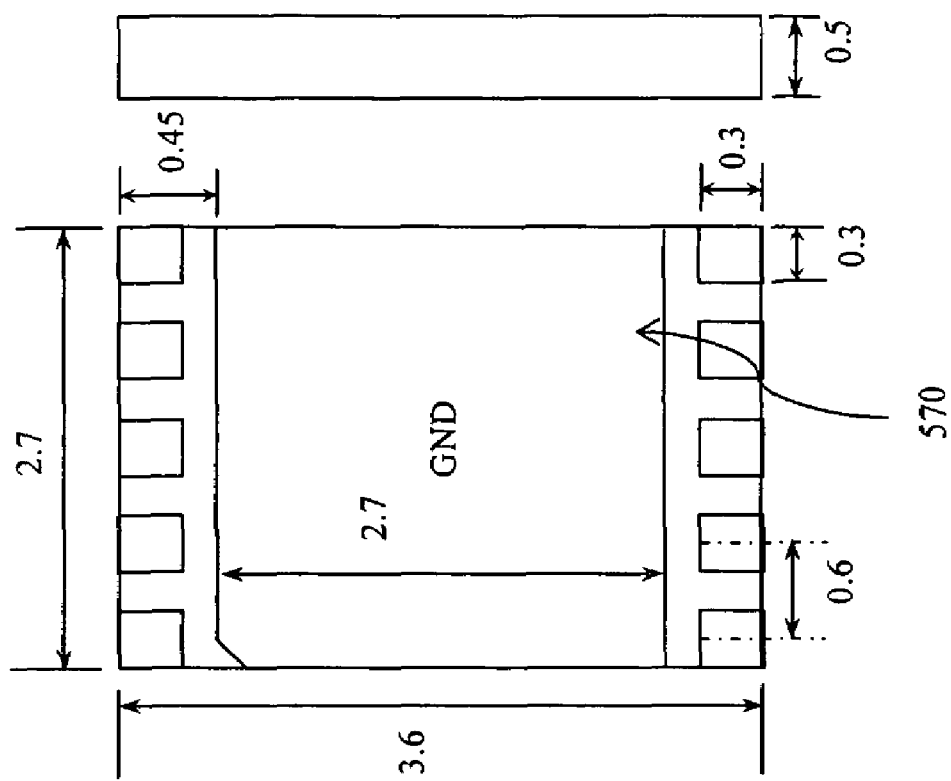
FIG. 6 shows an exemplary dimensions for one embodiment of FIG. 5.

FIG. 6 shows an exemplary dimensions for one embodiment of FIG. 5. In this embodiment, the power amplifier module 500 is characterized by substantially reduced dimensions. The module is approximately 3.6 mm long, 2.7 mm wide, and 0.5 mm thick as indicated in FIG. 6. The center ground plane 570 on the bottom side of the module is about 2.7 mm by 2.7 mm. Moreover, the pad dimension is about 0.3 mm by 0.3 mm, with inter-pad separation of 0.6 mm from center to center.

Figure 7:
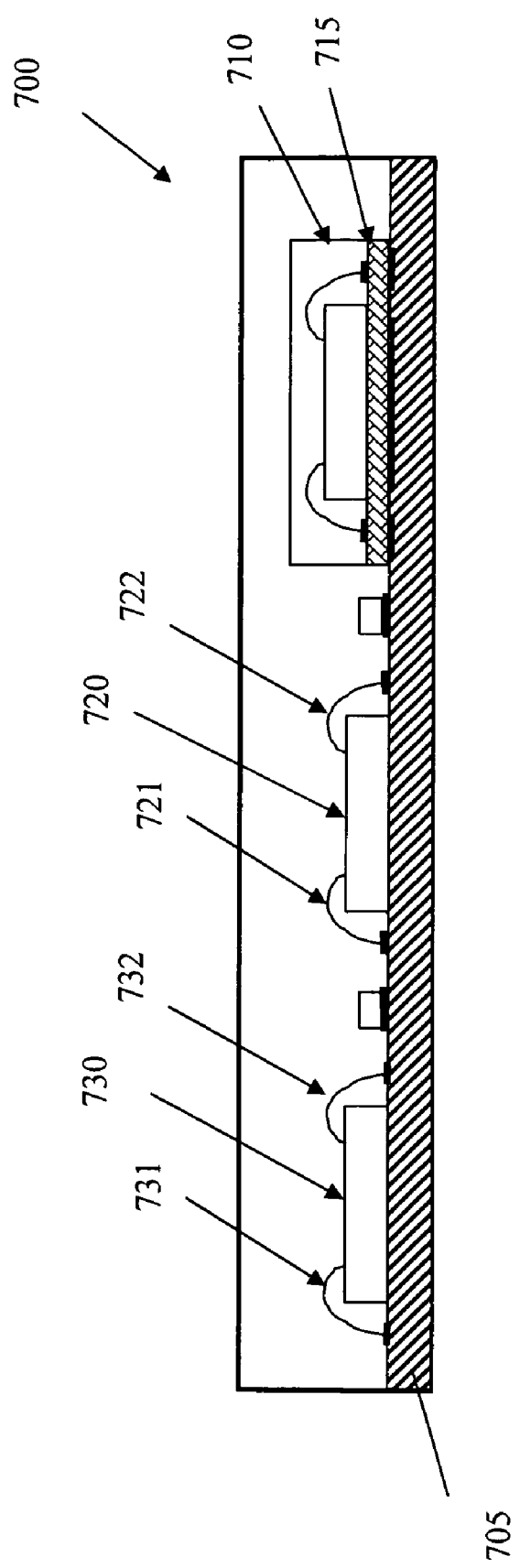
FIG. 7 shows an exemplary cross-sectional view of another embodiment of FIG. 5.

A wireless communication device 700 shown in FIG. 7 includes a substrate 705, a prepackaged power amplifier module 710, a radio frequency transceiver 720, and a base band digital signal processor 730. The prepackaged power amplifier module 710, a radio frequency transceiver 720, and a base band digital signal processor 730 are mounted on the substrate 705. The radio frequency transceiver 720 can up-convert electric signals from the base band digital signal processor 730 to radio frequency signals to be amplified by the prepackaged power amplifier module 710. The wireless communication device 700 can further include an antenna and TX/RX switch that can transmit wireless signals in response to the amplified radio frequency signals.

The antenna coupled with the TX/RX switch can also receive wireless signals to convert them to radio frequency signals. The radio frequency transceiver 720 can down-convert the radio frequency signals to low frequency electric signals to be processed by the base band digital signal processor 730.

The radio frequency transceiver 720 and the base band digital signal processor 730 can be bare die chips that are mounted to the substrate 705. The radio frequency transceiver 720 and the base band digital signal processor 730 can be electrically connected to each other and other electronic components in wireless communication device 700 by bond wires 721, 722, 731, 732. The radio frequency transceiver 720 and the base band digital signal processor 730 may be tested on wafer before the assembling to the wireless communication device 700.

In another embodiment, FIG. 8 illustrates a wireless communication device 800 including a substrate 805, a prepackaged power amplifier module 810, a radio frequency transceiver 820, and a base band digital signal processor 830. The prepackaged power amplifier module 810, a radio frequency transceiver 820, and a base band digital signal processor 830 are mounted on the substrate 805. The radio frequency transceiver 820 can up-convert electric signals from the base band digital signal processor 830 to radio frequency signals to be amplified by the prepackaged power amplifier module 810. The wireless communication device 800 can further include an antenna and TX/RX switch that can transmit wireless signals in response to the amplified radio frequency signals.

The antenna coupled with the TX/RX switch can also receive wireless signals to convert them to radio frequency signals. The radio frequency transceiver 820 can down-convert the radio frequency signals to low frequency electric signals to be processed by the base band digital signal processor 830. The radio frequency transceiver 820 and the base band digital signal processor 830 can be bare die chips that are mounted to the substrate 805. The radio frequency transceiver 820 and the base band digital signal processor 830 can be electrically connected to each other and other electronic components in wireless communication device 800 by bond wires 821, 822, 831, 832. The radio frequency transceiver 820 and the base band digital signal processor 830 may be tested on wafer before the assembling to the wireless communication device 800.

An example of the prepackaged power amplifier modules 710 and 810 is the power amplifier module 600 shown in FIGS. 6A and 6B. An example of a functional diagram and components for the prepackaged power amplifier modules 710 and 810 is shown in FIG. 5.

The prepackaged power amplifier module 710 includes a substrate 715 that allows it to be integrated into the wireless communication device 700. The substrate 715 includes electric interconnects with the terminals in the power amplifier. The substrate 715 can include a multiplayer printed circuit board (PCB), a lead frame, and lower-temperature co-fired ceramics (LTCC). The substrate 705 in the wireless communication device 700 includes electric interconnects that match the electric interconnects in the substrate 715 in the prepackaged power amplifier module 710. The prepackaged power amplifier module 710 can be plugged and readily bonded to the substrate 715.

The wireless communication device 700 is a packaged device that comprises a prepackaged power amplifier module 710. In the electronic technologies, the wireless communication device 700 can be categorized as Package in Package (PiP) or System in Package (SIP).

The prepackaged power amplifier module 710 includes all the proper electric terminals for in situ operation testing with radio frequency signals. The electric terminals can be electrically connected by wire bonding to the electric contacts on the die in the prepackaged power amplifier module 710. The prepackaged power amplifier module 710 can include impedance matching circuits for input and output RF signals with impedance at 50 ohm. The prepackaged power amplifier module 710 can also include electric terminals for power supply, biasing control, and power sensing.

With the smaller foot print and thinner thickness compared to prior art implementations, the prepackaged amplifier module 500 and 700 are ideal for miniaturized device applications. The wireless communication devices can be a cellular phone, mobile computers, handheld wireless digital devices, a WLAN adaptor, and other wireless electronic devices. The wireless communication device 500 can be compatible with cellular wireless communication standards such as 2G, 2.5G and 3G including Global System for Mobile Communications (GSM), General Packet Radio Service (GPRS), EDGE, Code Division Multiple Access (CDMA), Wideband CDMA, TD-SCDMA, Universal Mobile Telecommunications System (UMTS), etc., Wi-Fi wireless communication standards such as IEEE 802.11, and Wi-Max wireless communication standards such as IEEE 806.12, and others.

FIG. 7 shows an exemplary cross-sectional view of another embodiment of FIG. 5.

Although specific embodiments of the present invention have been illustrated in the accompanying drawings and described in the foregoing detailed description, it will be understood that the invention is not limited to the particular embodiments described herein, but is capable of numerous rearrangements, operating frequency bands, modifications, and substitutions without departing from the scope of the invention. For example, the frequency of a power amplifier is not restricted to 2.5 GHz or 3.5 GHz. The described system is compatible with power amplification at 5 GHz, 700 MHz, or any other radio frequencies. The following claims are intended to encompass all such modifications.

What is claimed is:

1. A multi-band power amplifier module, comprising:
a step gain terminal to provide a first step gain signal and a second step gain signal;
a first power amplifier configured to amplify a first input radio frequency signal in a first frequency band in response to a first bias control signal to produce a first output radio frequency signal;
a first bias circuit configured to output the first bias control signal;
a second power amplifier configured to amplify a second input radio frequency signal in a second frequency band in response to a second bias control signal to produce a second output radio frequency signal;
a second bias circuit configured to output the second bias control signal; and
first and second rows of pins oppositely positioned on the module and coupled respectively to the first and second power amplifiers and first and second bias circuits.

2. The multi-band power amplifier module of claim 1, further comprising
a power sensing terminal configured to receive a first power sensing signal and a second power sensing signal;
a first power sensing circuit configured to produce the first power sensing signal at the power sensing terminal, wherein the first power amplifier is configured to amplify the first input radio frequency signal in the first frequency band in response to the first power sensing signal; and
a second power sensing circuit configured to produce the second power sensing signal at the power sensing terminal, wherein the second power amplifier is configured to amplify the second input radio frequency signal in the second frequency band in response to the second power sensing signal.

3. The multi-band power amplifier module of claim 1, wherein each row of pins comprises approximately 2.7 millimeters (mm) in dimension.

4. The multi-band power amplifier module of claim 3, wherein each pin comprises approximately 0.3 mm ×0.3 mm.

5. The multi-band power amplifier module of claim 3, wherein each pin is spaced apart from each other by approximately 0.6 mm.

6. The multi-band power amplifier module of claim 1, further comprising a first side approximately 3.6 mm in width and a second side approximately 2.7 mm in length.

7. The multi-band power amplifier module of claim 1, further comprising a ground plane with dimensions of approximately 2.7 mm by 2.7 mm.

8. The multi-band power amplifier module of claim 7, wherein the ground plane has an indicator to indicate pin 1.

9. The multi-band power amplifier module of claim 1, wherein the input impedance for the input radio frequency signal is 50 ohm.

10. The multi-band power amplifier module of claim 1, wherein the frequency band is centered at approximately one of: 2.5 GHz, 3.5 GHz, 5 GHz.

11. A multi-band power amplifier module, comprising:
a step gain terminal to provide a first step gain signal and a second step gain signal;
a power sensing terminal configured to receive a first power sensing signal and a second power sensing signal;
a first power amplifier configured to amplify a first input radio frequency signal in a first frequency band in response to the first power sensing signal and the first step gain signal to produce a first output radio frequency signal;
a first power sensing circuit configured to produce the first power sensing signal at the power sensing terminal;
a second power amplifier configured to amplify a second input radio frequency signal in a second frequency band in response to the second power sensing signal and the second step gain signal to produce a second output radio frequency signal;
a second power sensing circuit configured to produce the second power sensing signal at the power sensing terminal; and
first and second rows of pins oppositely positioned on the module and coupled respectively to the first and second power amplifiers to output radio frequency signals.

12. The multi-band power amplifier module of claim 11, wherein each row of pins comprises approximately 2.7 millimeters (mm) in dimension.

13. The multi-band power amplifier module of claim 12, wherein each pin comprises approximately 0.3 mm ×0.3 mm.

14. The multi-band power amplifier module of claim 13, wherein each pin is spaced apart from each other by approximately 0.6 mm.

15. The multi-band power amplifier module of claim 11, further comprising a first side approximately 3.6 mm in width and a second side approximately 2.7 mm in length.

16. The multi-band power amplifier module of claim 11, further comprising a ground plane with dimensions of approximately 2.7 mm by 2.7 mm.

17. The multi-band power amplifier module of claim 7, wherein the ground plane comprises a notch to indicate pin 1.

18. The multi-band power amplifier module of claim 11 wherein the frequency band is centered at approximately one of: 2.5 GHz, 3.5 GHz, 5 GHz.

19. The multi-band power amplifier module of claim 11, comprising a first side approximately 3.6 mm in width, a second side approximately 2.7 mm in length, and a thickness of approximately 0.5 mm, wherein each row of pins comprises approximately 2.7 millimeters (mm) in dimension, wherein each pin comprises approximately 0.3 mm ×0.3 mm and spaced apart from each other by approximately 0.6 mm.

20. The multi-band power amplifier module of claim 11, further comprising
a first output terminal configured to receive the first output radio frequency signal; and
a second output terminal configured to receive the second output radio frequency signal;
wherein the first output terminal is positioned in the first row and the second output terminal is positioned in the second row.

* * * * *